United States Patent [19]
Kurihara et al.

[11] Patent Number: 4,757,473
[45] Date of Patent: Jul. 12, 1988

[54] MEMORY CIRCUIT

[75] Inventors: Ryoichi Kurihara, Hadano; Hiroaki Aotsu, Yokohama; Toshihiko Ogura, Ebina; Koichi Kimura, Yokohama; Tadashi Kyoda; Hiromichi Enomoto, both of Hadano, all of Japan

[73] Assignee: Hitachi, Ltd., Tokyo, Japan

[21] Appl. No.: 865,376

[22] Filed: May 21, 1986

[30] Foreign Application Priority Data

May 22, 1985 [JP]  Japan ................................ 60-108107

[51] Int. Cl.⁴ ............................................. G11C 7/00
[52] U.S. Cl. ..................................... 365/189; 365/240
[58] Field of Search ............... 365/189, 219, 230, 239, 365/240

[56] References Cited

U.S. PATENT DOCUMENTS 4,402,067  8/1983  Moss et al. .......................... 365/219
4,639,890  1/1987  Heilveil et al. .................. 365/189 X

OTHER PUBLICATIONS

S. Ishimoto et al., "A 256K Dual Port Memory", 1985, IEEE International Solid-State Circuits Conference, Digest of Technical Papers, pp. 38-39.

Primary Examiner—Joseph A. Popek
Attorney, Agent, or Firm—Antonelli, Terry & Wands

[57] ABSTRACT

A dual-port memory circuit comprises a random port having a memory cell array randomly accessable and a serial port serially readable or writable from/to the memory cell array. In the memory circuit, two modes are provided to the serial port, and when a first mode is designated, the data are consecutively read or written a plurality of bits at a time, and when a second mode is designated, the data are consecutively read or written one bit at a time. High speed read/write operation is attained by designating the mode to allow parallel input/output. For an application which does not require high speed operation, the number of components to be externally added to the memory circuit can be reduced.

7 Claims, 8 Drawing Sheets

F I G. 2
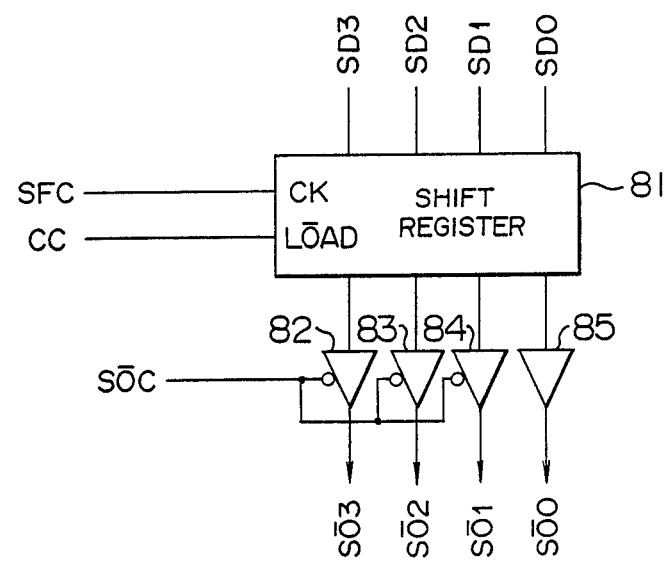

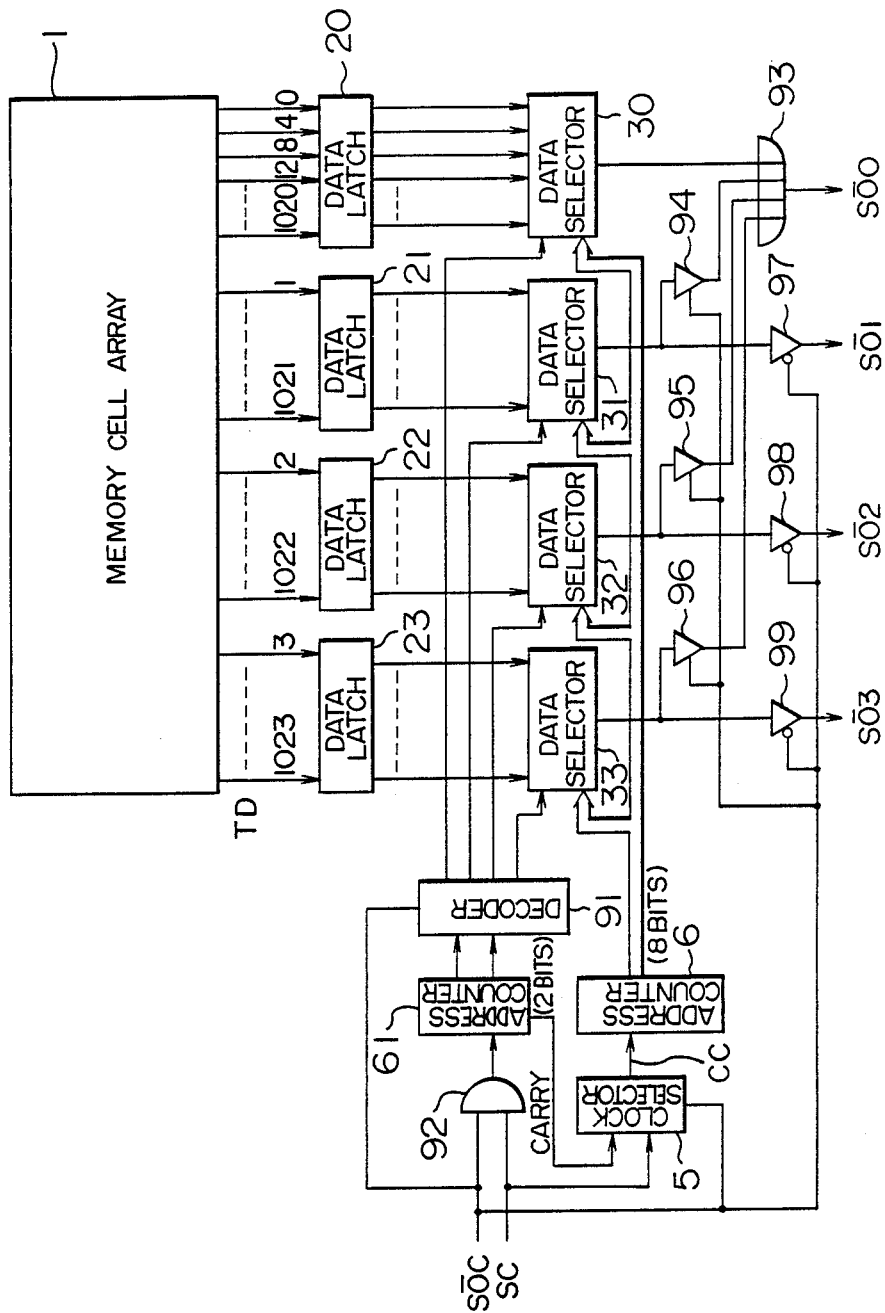
F I G. 5

MEMORY CIRCUIT

BACKGROUND OF THE INVENTION

The present invention relates to a memory circuit, and more particularly to a memory circuit which permits serial or parallel data output.

A memory element suitable for image processing is described in an article by Ishimoto et al, entitled "A 256K Dual-Port Memory", 1985 IEEE International Solid-State Circuits Conference Digest of Papers, pages 38–39. The disclosed dual-port memory comprises a random port constructed by a conventional randomly readable and writable 64K-words×4-bits memory cell array, and a serial port which can be consecutively read out 4 bits in parallel by a clock operation from a 256-words×4-bits data latch circuit. A prior art device which uses such a dual-port memory such as, for example, an image memory of a video display is explained. The serial port of the dual-port memory can be consecutively read out 4 bits in parallel at a cycle time of 40 nanoseconds. Thus, a 10 ns serial data is produced by converting the 4-bit parallel to serial data by a shift register arranged externally of the memory so that the data is fitted to a dot rate necessary to a high resolution video display. A dot rate necessary to a conventional 640×400-dots display is approximately 45 ns. When a cycle time of the serial port output of the dual-port memory is set to 40 ns, it appears that the serial port output can be used as it is. However, in this case, the following problem is encountered.

FIG. 9 shows a configuration of 4 frames of image memory for a 16-color display in a 640×400-dots display. Since the number of pixels is equal to 640×400=256,000 dots, one 64K-words ×4-bits dual-port memory is required for one frame of memory, and the 4 frames of image memory comprise four memories. In FIG. 9, data times RD0, -----, RD15 at the random ports of dual-port memories 11, 12, 13 and 14 are connected to a 16-bit width data bus 10 of a CPU (Central Processing Unit, not shown). The data lines RD0, -----, RD15 are connected to four random ports, of which only one random port 111 is shown with the internal configuration of dual port memory 11. Data output lines SD0, -----, SD15 from serial ports 112 etc. are connected to input terminals of shift registers 15, 16, 17 and 18, four lines per shift register, and output lines SF1, -----, SF4 therefrom are connected to input terminals of a color palette 19. The color palette 19 decodes signals applied from the output lines SF1, -----, SF4 to select one of sixteen colors to produce color signals R (red), G (green) and B (blue).

A problem encountered here is that, in the conventional display, the shift register 15 is required externally of the dual-port memory 11 to produce the signal SF1, and a total of four shift registers are required. Thus, the number of components increases.

On the other hand, it is possible to configure the memory such that the shift register 15 is accommodated within the dual-port memory 11. In this case, however, the memory cannot be applied to the high resolution display.

SUMMARY OF THE INVENTION

It is an object of the present invention to provide a memory circuit which can selectively read out a parallel data bit output and a serial data bit output from a memory cell array in accordance with a mode designation.

The memory circuit according to one feature of the present invention comprises a memory cell array which can read out plural bits of data in parallel, a data latch circuit which holds the read-out data bits, and a control circuit based on a signal given from an outside device which indicates one of two modes for selecting a plurality of data bits to be outprtted in parallel from the data latch circuit when the signal indicates a first mode and selecting the data bits to be outputted serially bit by bit from the data latch circuit when the signal indicates a second mode.

It is another object of the present invention to provide a memory circuit which can select a parallel data bit input and a serial data bit input to be written into the memory cell array of the memory circuit in accordance with a mode designation.

The memory circuit according to another feature of the present invention comprises a memory cell array which can write plural bits of data in parallel, a data latch circuit which holds data bits to be written, and a control circuit based on a signal from outside which designates one of two modes for selecting a plurality of data bits to be supplied in parallel to the data latch circuit when the signal indicates a first mode and selecting the data bits to be supplied serially bit by bit to the data latch circuit when the signal indicates a second mode.

BRIEF DESCRIPTION OF THE DRAWINGS

FIG. 2 is a block diagram of an internal configuration of a shift register 8, FIG. 5 is a block diagram of another embodiment of the memory circuit of the present invention.

DESCRIPTION OF THE PREFERRED EMBODIMENTS

Figure 1:
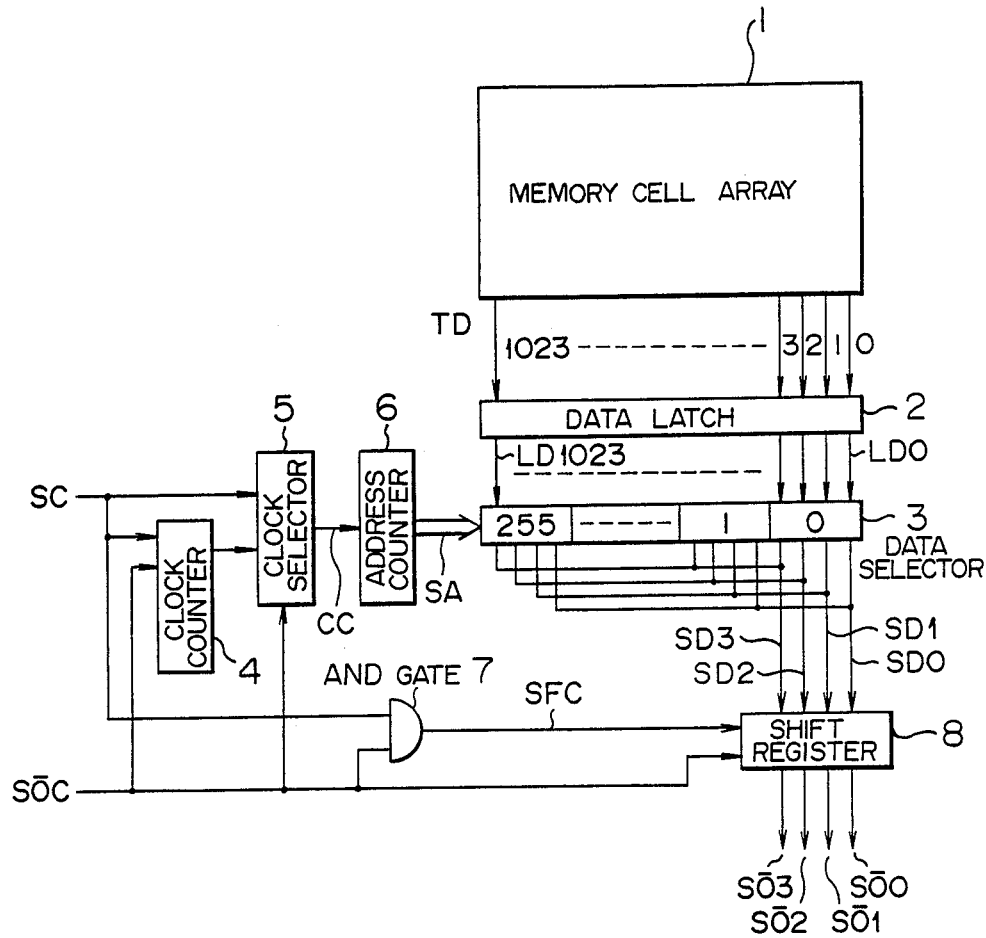
FIG. 1 is a block diagram of one embodiment of a memory circuit of the present invention.

FIG. 1 shows a block diagram of one embodiment of a memory circuit of the present invention. A memory cell array 1 may be a 256K-bit memory of 256×1024 matrix configuration, which can read out 1024-bit data in parallel. The read data $TD_0$, -----, $TD_{1023}$ are latched in a data latch circuit 2 by a control signal, not shown. Outputs of the data latch circuit 2 are supplied to input terminals of a data selector 3 through signal lines $LD_0$, -----, $LD_{1023}$. The data selector 3 selects designated four consecutive bits out of the 1024 bits. Accordingly, the outputs of the data selector 3 are wired-ORed 256 bits in group so that 4-bit serial data are produced on signal lines $SD_0$, ---, $SD_3$. Those serial data are applied to input terminals of a shift register 8 which produces outputs on signal lines $SO_0$, ---, $SO_3$. The shift register 8 has a first mode in which the serial data on the signal lines $SD_0$, ---, SD$_3$ are outputted in parallel as they are and a second mode in which they are parallel-to-serial converted by a shift clock signal SFC and a serial output control signal SOC. In the second mode, the input serial data on the signal line SD$_0$, ---, SD$_3$ are outputted to a serial output signal line SO$_0$ in the sequence of SD$_0$, SD$_1$, SD$_2$ and SD$_3$ in synchronism with the shift clock SFC. At this time, the serial output signal lines SO$_1$, ---, SO$_3$ are rendered in a high impedance state by the serial output control signal SOC.

A circuit for controlling the data circuit described above is explained. The clock signal SC which drives the data selector 3 and the shift register 8 is applied to the clock selector 5, the clock counter 4 and the AND gate 7. The clock counter 4 counts the clock signal SC under the control of the serial output control signal SOC to produce a signal as high as four times the input period, which is applied to the clock selector 5. The serial output control signal SOC is applied to the clock counter 4, the clock selector 5, the AND gate 7 and the shift register 8. The clock selector 5 selects the clock signal SC or the four-times period signal from the clock counter 4 depending on whether the serial output control signal SOC is at a low level or a high level respectively to produce a count clock signal CC. The count clock signal CC is applied to the address counter 6 which is incremented by one in synchronism with the count clock signal CC and an 8-bit parallel select address SA from the address counter 6 is applied to the data selector 3.

FIG. 2 shows a block diagram of the shift register 8. Numeral 81 denotes a conventional 4-bit shift register. The signal CC is applied to a terminal LOAD of the shift register 81, and information on the lines SD$_0$–SD$_3$ is latched to the shift register 81 when the signal CC rises. A terminal CK receives a shift clock and a signal SFC is applied thereto so that the information in the shift register 81 is shifted by one bit. When the signal SFC has a low level, no shift occurs. Numerals 82–85 denote buffer gates. When the signal SOC has a low level, the buffer gates 82–85 produce outputs. When the signal SOC has a high level, only the buffer gate 85 produces the output and the buffer gates 82–84 produce no output.

Figure 3:
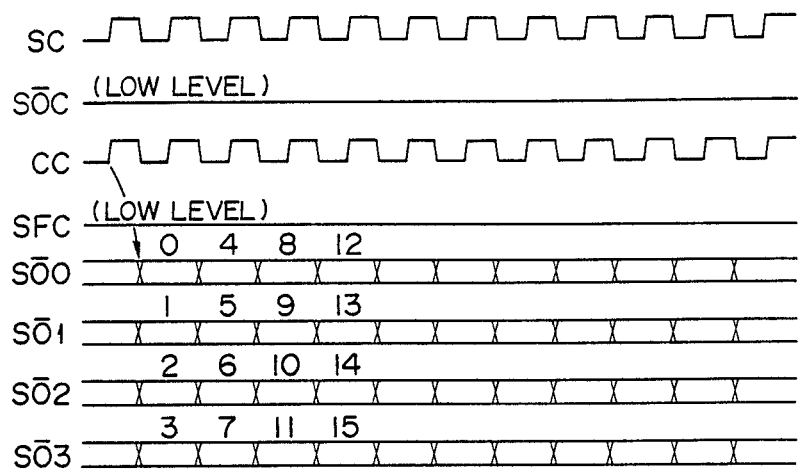
FIG. 3 shows a time chart for explaining an operation in one mode in the embodiment shown in FIG. 1.
Figure 4:
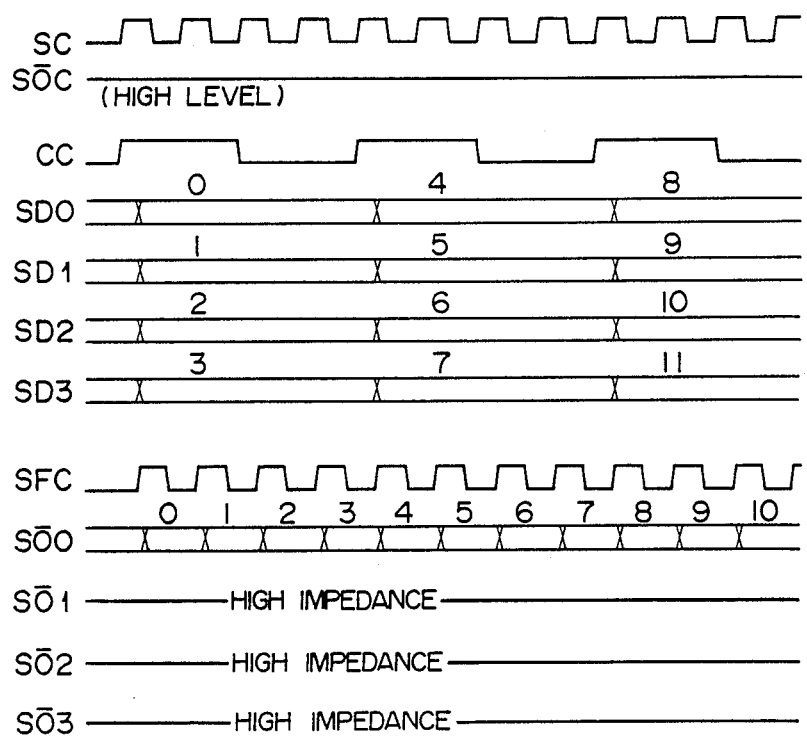
FIG. 4 shows a time chart for explaining an operation in the other mode in the embodiment shown in FIG. 1.

FIG. 3 shows a time chart for explaining the operation in a first mode of the shift register 8 in which the serial data on the signal lines SD$_0$, ---, SD$_3$ are parallelly outputted as they are. Since the serial output control signal SOC has a low level, the clock signal SC is selected as the count clock CC, and the serial output signal on the signal lines SO$_0$, ---, SO$_3$ are outputted in 4-bit parallel at the period of the FIG. 4 shows a time chart for explaining the operation in a second mode of the shift register 8 in which the data are parallel-to-serial converted and the serial output is produced only on the signal line SO$_0$. Since the serial output control signal SOC is held at the high level at this time, the four-times period signal is selected as the count clock CC and the serial data on the signal lines SD$_0$, ---, SD$_3$ are selected at the period which is four times as long as the period of the clock signal SC. On the other hand, the AND gate 7 is conditioned and the shift register 8 parallel-to-serial converts the data by the shift clock SFC which is synchronized with the clock signal SC so that the serial data are serially outputted on the signal line SO$_0$.

In this manner, the 4-bit parallel output and the parallel-to-serial converted 1-bit output are selectively produced by the serial output control signal SOC.

FIG. 5 is a block diagram of another embodiment of the memory circuit of the present invention. A data latch circuit is divided into four data latches 20–23 each of which latches 256 bits of information. Of the data read from a memory cell array 1, data TD$_0$, TD$_4$, -----, TD$_{1020}$; TD$_1$, TD$_5$, -----, TD$_{1021}$; TD$_2$, TD$_6$, TD$_{1022}$ and TD$_3$, TD$_7$, -----, TD$_{1023}$ are latched in the data latches 20–23, respectively. Data selectors 30–33 are connected to the data latches 20–23, respectively, each of which selects one of the 256 bits in each data latch. The signals SOC and SC are applied to an AND gate 92. An address counter 61 is a 2-bit counter which counts an output signal of the AND gate 92. A decoder 91 decodes the 2-bit output of the address counter 61 when the signal SOC is at a high level, and one of the data selectors 30–33 is rendered at the high level by the output of the decoder 91. When the signal SOC has the low level, all outputs of the decoder 91 are at the high level without regard to the output of the address counter 61 so that all data selectors 30–33 are selected. A clock selector 5 selects the clock signal SC or a carry signal from the address counter 61 depending on whether the signal SOC is at the low level or high level respectively, an address counter 6 is an 8-bit counter which counts the output signal CC of the clock selector 5 to simultaneously select the corresponding bit positions of the data selectors 30–33. Numerals 94–96 denote buffer gates which are enabled when the signal SOC is at the high level. Numerals 97–99 denote buffer gates which are enabled when the signal SOC is at the low level and produce the outputs SO$_1$–SO$_3$, respectively. Numeral 93 denotes an OR circuit which OR's the outputs of the data selector 30 and the buffer gates 94–96 to produce the output SO$_0$.

In operation, when the signal SOC is at the low level, the decoder 91 selects all of the data selectors 30–33 so that the data selectors 30–33 parallelly produce serial data starting with TD0, TD1, ---, TD$_3$ depending on the count of SC counted by the address counter 6. Those outputs are produced as SO$_0$, SO$_1$, ---, SO$_3$ through the OR circuit 93 and the buffer gates 97–99. On the other hand, when the signal SOC is at the high level, one of the data selectors 30–33 are sequentially selected depending on the count of SC counted by the address counter 61 and whenever the address counter 61 produces a carry signal, it is counted by the address counter 6 so that the corresponding bit positions of the data selectors 30–33 are sequentially selected. Thus, the outputs are selected in the sequence of bit 0 of the data selector 30, bit 0 of the data selector 31, bit 0 of the data selector 32, bit 0 of the data selector 33, bit 1 of the data selector 30, bit 1 of the data selector 31, -----. The outputs of the data selector 30–33 are sequentially outputted to the line SO$_0$ through the OR circuit 93 and the buffer gates 94–96. The sequence of the data bits produced on the line SO$_0$ is shown in FIG. 4.

Figure 6:
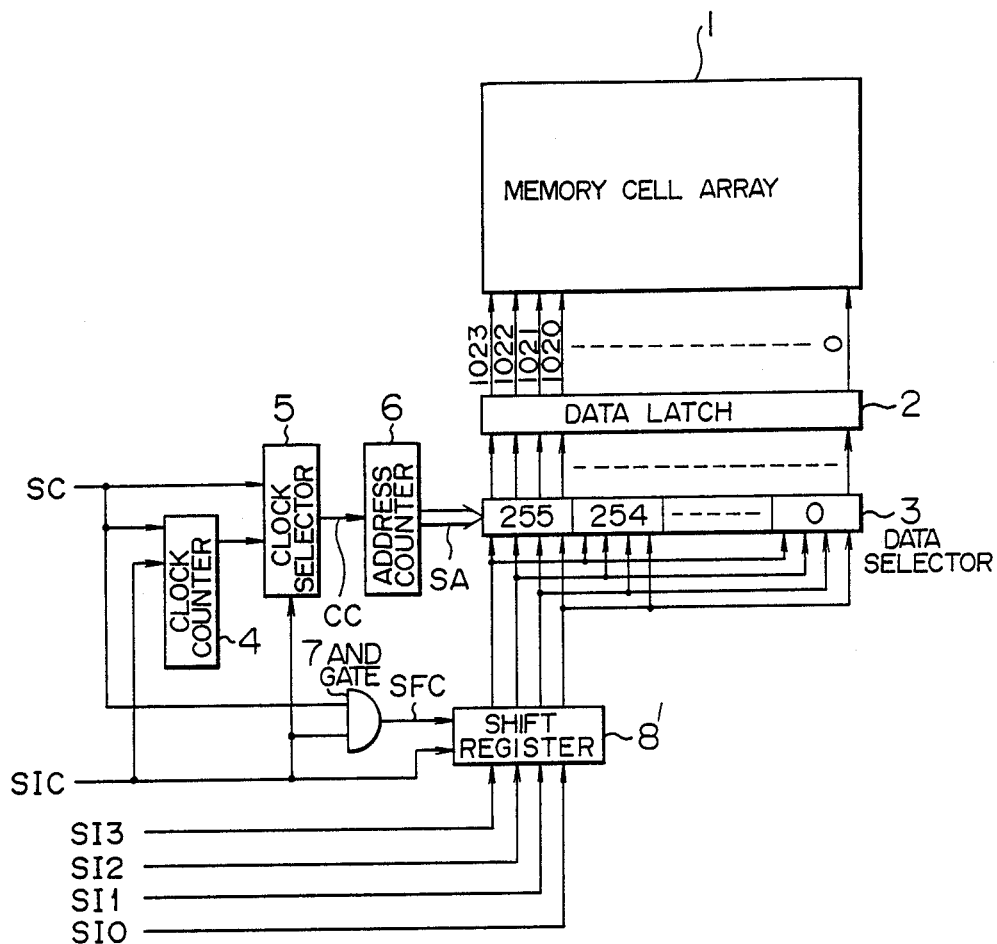
FIG. 6 is a block diagram of another embodiment of the memory circuit of the present invention.

FIG. 6 shows a block diagram of other embodiment of the memory circuit of the present invention. In the embodiment of FIG. 1, the four bits and the one bit of the serial output are selectively used. In the present embodiment of FIG. 6, four bits and one bit of a serial input are selectively used. The like elements to those shown in FIG. 1 are designated by the like numerals. Because the serial input is switched, the flow of the data signal is upside down. Depending on whether the serial input control signal SIC is at the low level or at the high level, a first mode in which the serial input signals $SI_0$, ---, $SI_3$ are latched from the data selector 3 to the data latch 2 in 4-bit parallel or a second mode in which only one bit of the serial input signal $SI_3$ is inputted is selected. The configuration of the shift register 8' shown in FIG. 6 is similar to that shown in the block diagram of FIG. 2. In FIG. 6, SOC, $SO_0$, $SO_1$, $SO_2$ and $SO_3$ shown in FIG. 2 are substituted by SIC, $SI_0$, $SI_1$, $SI_2$ and $SI_3$, respectively, the flow of data signals are upside down, the buffer gate 85 is connected to $SI_3$ in the opposite direction, and the buffer gates 82, 83 and 84 are connected to $SI_2$, $SI_1$ and $SI_0$ in the opposite direction.

Figure 7:
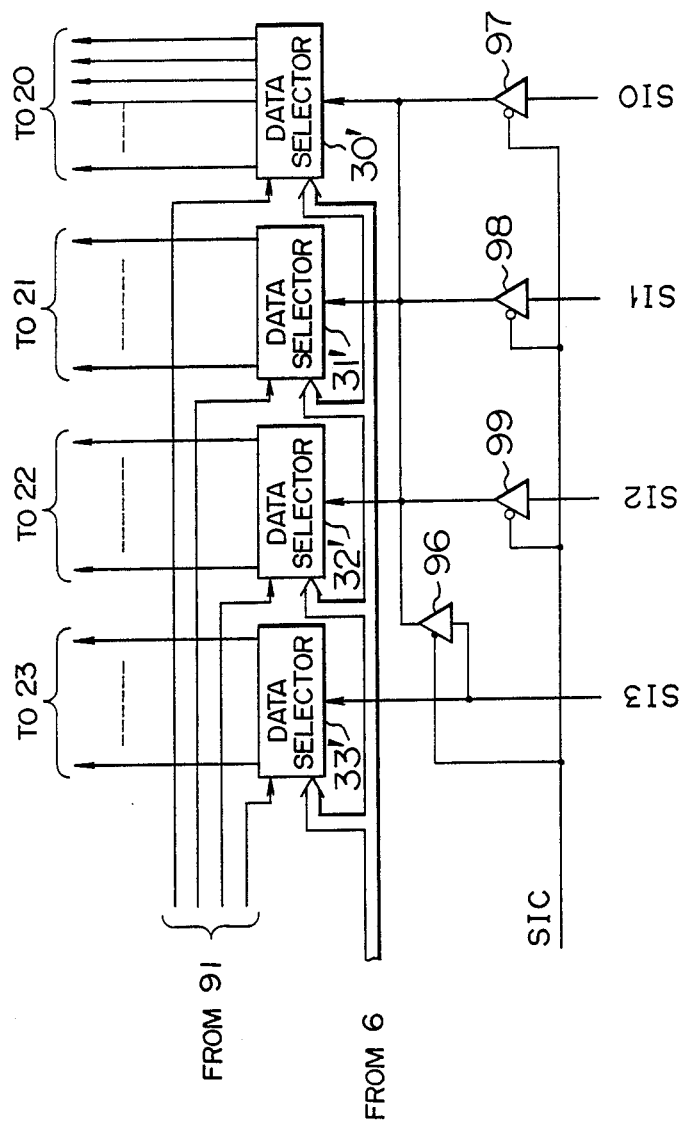
FIG. 7 is a block diagram of a further embodiment of the memory circuit of the present invention.

FIG. 7 shows a block diagram of a further embodiment of the memory circuit of the present invention in an input version, which corresponds to the block diagram of FIG. 5. In FIG. 7, SOC, $SO_0$, $SO_1$, $SO_2$ and $SO_3$ of FIG. 5 are substituted by SIC, $SI_0$, $SI_1$, $SI_2$ and $SI_3$, respectively. The elements omitted in FIG. 7 are identical to those shown in FIG. 5. Numerals 97–99 denote buffer gates which are enabled when SIC is at the low level and enable inputs from $SI_2$, $SI_1$ and $SI_0$, respectively. Numeral 96 denotes a buffer gate which is enabled when SIC is at the high level to allow input from $SI_3$ to be applied to any of the data selectors 30'–33'. The data selectors 30'–33' correspond to the data selectors 30–33. Input lines thereof are internally wired-ORed and connected to 256 gates which are controlled by signals from the decoder 91 and the address counter 6 so that one of the 256 output lines is selected. Again, depending on whether the serial input control signal SIC is at the low level or at the high level, a first mode in which the serial input signals $SI_0$, ---, $SI_3$ are latched from the data selectors 30'–33' to the data latches 20–23, 4 bits in parallel, or a second mode in which only one bit of the serial input signal $SI_3$ is inputted is selected.

In the above embodiments, the number of input or output parallel bits is four, although it is not restrictive. The serial output control signal SOC or the serial input control signal SIC is directly controlled from outside in the above embodiments. In a dual-port memory having means for designating arithmetic functions operated on between the input data externally supplied to the random port and the data read from the memory cell array, the first mode and the second mode for the serial inputs or outputs can be designated by such employing means.

Figure 8:
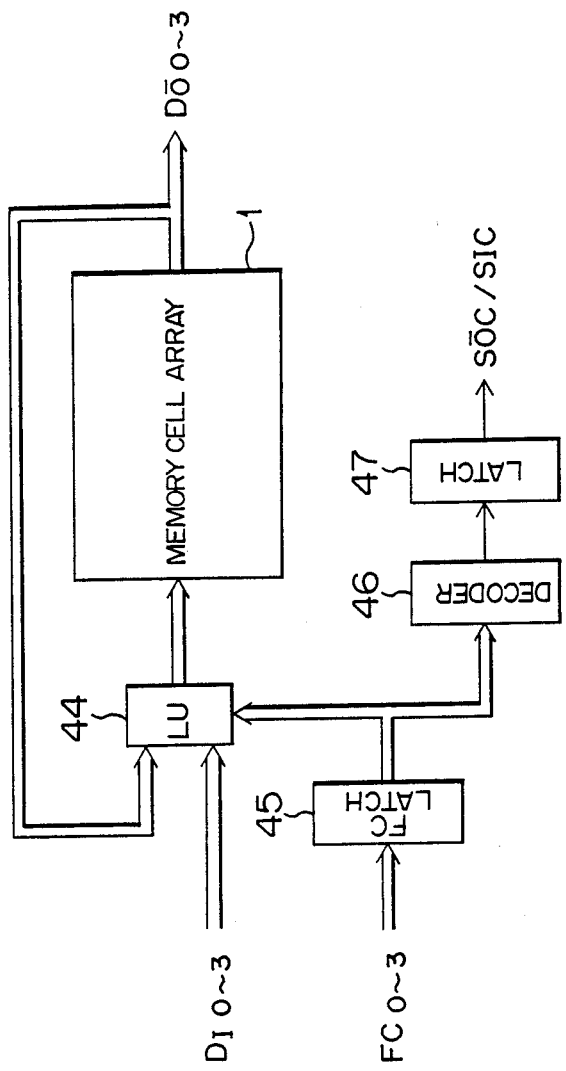
FIG. 8 is a block diagram of an embodiment for generating an SOC/SIC signal.
Figure 9:
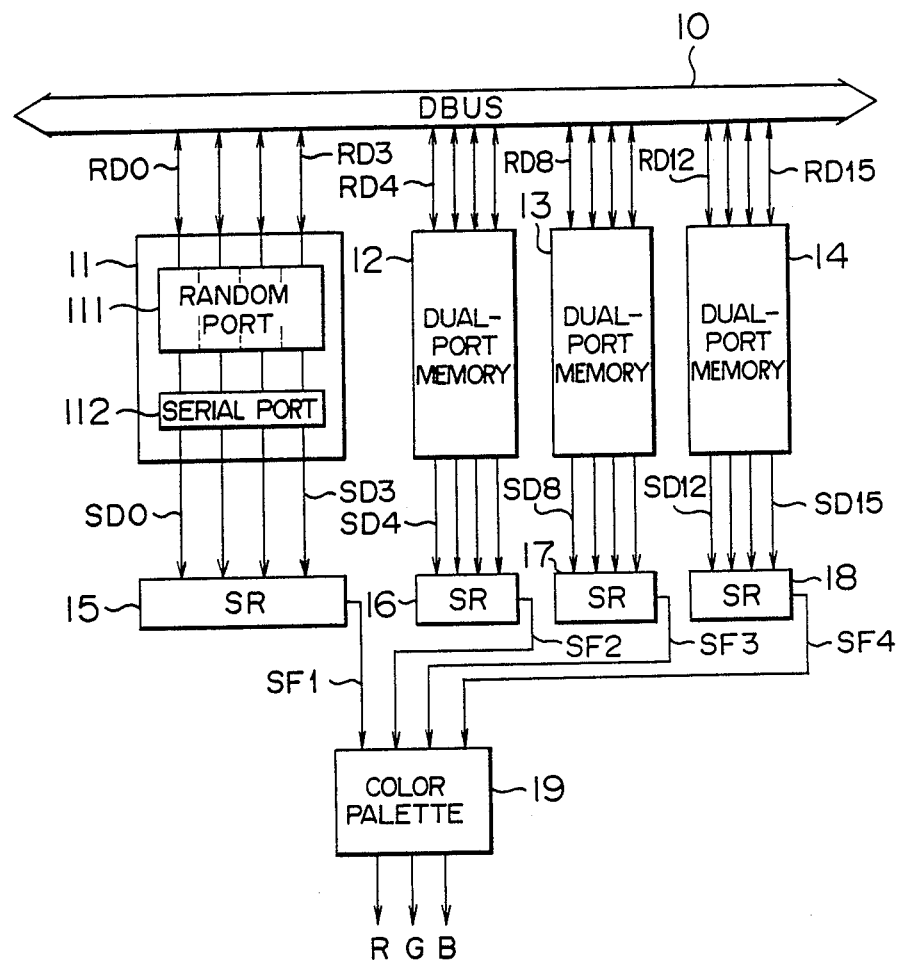
FIG. 9 is a block diagram of a prior art memory circuit.

FIG. 8 shows a block diagram of a circuit for setting the SOC/SIC mode by using the arithmetic operation means. $FC_0$–$FC_3$ denote four signal lines through which an operation code for designating a type of operation is sent, numeral 45 denotes a latch for holding the 4-bit operation code, numeral 44 denotes a logic operation unit which receives both input signals $DI_0$–$DI_3$ and output signals $DO_0$–$DO_3$ from the memory cell array 1 to perform the designated operation, numeral 46 denotes a decoder which decodes the operation code in the latch 45 for the SOC/SIC mode setting, and numeral 47 denotes a latch to which one bit information indicating a first mode or a second mode, which is the output of the decoder 46 is held. The operation code on the signal lines $FC_0$–$FC_3$ is set into the latch 45. When it is the operation code to indicate the SOC/SIC mode setting, it is decoded by the decoder 46 and the mode is set in the latch 47. The output terminal of the latch 47 is connected to the SOC/SIC signal line which defines the SOC/SIC mode.

Those skilled in the art can easily incorporate the serial outputs and inputs separately shown in FIGS. 1 and 6 into one device. In this case, the serial input signal and the serial output signal may share a common terminal.

The present invention offers the following advantages.

(1) The serial input/output signal is selectively handled as the plural-bit parallel input/output or 1-bit input/output. Thus, the number of external components required with the memory circuit can be reduced for the 1-bit input/output.

(2) The present memory circuit is applicable to a high speed input/output which requires parallel input/output.

(3) Since the mode selection function is provided for serial input/output a manufacturer can meet both by manufacturing only one type of memory, element. Thus, the management of manufacturing and sales can be improved.

We claim:

1. A memory circuit comprising:
    a memory cell array including means for reading out data bits contained in a row of the array in parallel;
    a data latch circuit for holding the read data bits;
    a signal line for applying a control signal to indicate one of two modes to said data latch circuit; and
    a control circuit connected to said signal line for causing said data latch circuit to selectively output a plurality of said data bits in parallel when said control signal incidates a first mode and for causing said data latch circuit to selectively output said plurality of data bits serially one bit at a time when said control signal indicates a second mode.

2. A memory circuit according to claim 1 wherein said control circuit includes a selection circuit for outputting the plurality of data bits in parallel by selecting the plurality of bit positions of said data latch circuit, and a shift register connected to said selector circuit for outputting the data bits selected in parallel by said selection circuit as they are when said control signal line indicates the first mode and for converting the data bits selected by said selection circuit to output the data bits bit by bit when said signal line indicates the second mode.

3. A memory circuit according to claim 1 further comprising:
    a code latch for temporarily storing an operation code externally supplied thereto;
    a decoder for decoding the contents of said code latch; and
    a mode latch for holding the output of said decoder; said signal line being connected to said mode latch.

4. A memory circuit comprising:
    a memory cell array including means for reading out data bits controlled in a row of the array in parallel;
    a data latch circuit for holding the data bits to be written into said memory cell array;
    a signal line for applying a signal to indicate one of first and second modes to said data latch circuit; and
    a control circuit connected to said signal line for selecting a plurality of data bits to be supplied in parallel to said data latch circuit when said signal line indicates the first mode and for selecting data bits to be supplied serially bit by bit to said data latch circuit when said signal line indicates the second mode.

5. A memory circuit according to claim 4 wherein said control circuit includes a selection circuit for supplying the plurality of data bits in parallel by selecting the plurality of bit positions of said data latch circuit, and a shift register connected to said selection circuit for supplying the data bits to said control selection circuit as they are when said signal indicates the first mode and for converting the data bits to be serially supplied bit by bit to said selection circuit when said control signal indicates the second mode.

6. A memory circuit according to claim 4 further comprising:
- a code latch for temporarily storing an operation code externally supplied thereto;
- a decoder for decoding the contents of said code latch; and
- a mode latch for holding the output of said decoder;
said signal line being connected to said mode latch.

7. A memory circuit comprising:
- a memory cell array including means for reading out data bits contained in a row of the array in parallel;
- a data latch circuit for holding data bits to be read-out from said memory cell array;
- a signal line for applying a control signal to indicate one of first and second modes and
- a control circuit connected to said signal line for selecting a plurality of data bits to be outputted in parallel from said data latch circuit when said control signal indicates the first mode and the selecting the data bits to be outputted serially bit by bit from said data latch circuit when said control signal indicates the second mode.

* * * * *